US011587708B2

(12) United States Patent
Nguyen et al.

(10) Patent No.: US 11,587,708 B2
(45) Date of Patent: Feb. 21, 2023

(54) MAGNETIC DEVICE WITH A HYBRID FREE LAYER STACK

(71) Applicants: IMEC vzw, Leuven (BE); Katholieke Universiteit Leuven, Leuven (BE)

(72) Inventors: Van Dai Nguyen, Wavre (BE); Sebastien Couet, Grez-Doiceau (BE); Olivier Bultynck, Lovenjoel (BE); Danny Wan, Leuven (BE); Eline Raymenants, Bonheiden (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 219 days.

(21) Appl. No.: 17/038,470

(22) Filed: Sep. 30, 2020

(65) Prior Publication Data

US 2021/0104344 A1 Apr. 8, 2021

(30) Foreign Application Priority Data

Oct. 2, 2019 (EP) .................................... 19201001

(51) Int. Cl.

| | |
|---|---|
| ***G11C 11/16*** | (2006.01) |
| ***H01F 10/32*** | (2006.01) |
| ***G01R 33/09*** | (2006.01) |
| ***H01L 27/22*** | (2006.01) |
| ***H01L 43/02*** | (2006.01) |
| ***H01L 43/08*** | (2006.01) |
| ***H01L 43/10*** | (2006.01) |
| ***H01L 43/12*** | (2006.01) |

(52) U.S. Cl.

CPC ....... *H01F 10/3286* (2013.01); *G01R 33/093* (2013.01); *G11C 11/161* (2013.01); *H01L 27/222* (2013.01); *H01L 43/02* (2013.01); *H01L 43/08* (2013.01); *H01L 43/10* (2013.01); *H01L 43/12* (2013.01)

(58) Field of Classification Search

CPC ....... H01L 27/222; H01L 43/02; H01L 43/08; H01L 43/10; H01L 43/12; H01F 10/3286; G11C 11/161; G01R 33/093

USPC .......................................................... 257/421

See application file for complete search history.

(56) References Cited

U.S. PATENT DOCUMENTS 10,453,510 B2 * 10/2019 Park ........................ H01L 43/10
10,516,097 B2 * 12/2019 Park ........................ H01L 43/10

(Continued)

OTHER PUBLICATIONS

Ajejas et al., "Tuning domain wall velocity with Dzyaloshinskii-Moriya interaction", *Appl. Phys. Lett.*, 111(20), 202402, 1-5, (2017).

(Continued)

*Primary Examiner* — Jami Valentine Miller

(74) *Attorney, Agent, or Firm* — Knobbe, Martens, Olson & Bear, LLP

(57) ABSTRACT

In one aspect, the disclosed technology relates to a magnetic device, which may be a magnetic memory and/or logic device. The magnetic device can comprise a seed layer; a first free magnetic layer provided on the seed layer; an interlayer provided on the first free magnetic layer; a second free magnetic layer provided on the interlayer; a tunnel barrier provided on the second free magnetic layer; and a fixed magnetic layer. The first free magnetic layer and the second free magnetic layer can be ferromagnetically coupled across the interlayer through exchange interaction.

21 Claims, 8 Drawing Sheets

(56) References Cited

U.S. PATENT DOCUMENTS

| | | | | |
|---|---|---|---|---|
| 10,580,964 | B2 * | 3/2020 | Park | H01L 43/12 |
| 11,050,014 | B2 * | 6/2021 | Park | H01L 43/08 |
| 11,152,047 | B2 * | 10/2021 | Jung | H01L 43/08 |
| 11,474,167 | B1 * | 10/2022 | Wu | G01R 33/07 |
| 2017/0179373 | A1 | 6/2017 | Swerts et al. | |
| 2020/0350489 | A1 * | 11/2020 | Park | G11C 11/161 |
| 2022/0068339 | A1 * | 3/2022 | Dieny | G01R 33/093 |
| 2022/0208244 | A1 * | 6/2022 | Song | H01L 43/04 |

OTHER PUBLICATIONS

Caretta et al., "Fast current-driven domain walls and small skyrmions in a compensated ferrimagnet", *Nature Nanotechnology*, 13, 1154-1160 (2018).

Choi et al., "Double Pinned Perpendicular-Magnetic-Tunnel-Junction Spin-Valve Providing Multilevel Resistance States", *Scientific Reports*, 9(1), 11932, 1-9 (2019).

Miron et al., "Fast current-induced domain-wall motion controlled by the Rashba effect", *Nature Materials*, 10, 419-423, (2011).

Parkin et al., "Memory on the racetrack", *Nature Nanotechnology*, 10, 195-198 (2015).

Yang et al., "Domain-wall velocities of up to 750 m s-1 driven by exchange-coupling torque in synthetic antiferromagnets", *Nature Nanotechnology*, 10, 221-226, (2015).

Partial European Search Report dated May 19, 2020 in counterpart European Application No. 19201001.5 in 11 pages.

Extended European Search Report dated Aug. 19, 2020 in European Application No. 19201001.5 in 9 pages.

* cited by examiner 10
11
12
13
14
15
16
16
Reading DW by TMR
Writing DW by STT
SOT driven
DW motion
DW transport
protected Reading DW by TMR
Writing DW by STT
TE
TE
BE
BE
Interlayer
Heavy metal
SOT driven
DW motion
10
11
12
13
14
15
16

MAGNETIC DEVICE WITH A HYBRID FREE LAYER STACK

CROSS-REFERENCE TO RELATED APPLICATIONS

This application claims foreign priority to European Patent Application No. EP 19201001.5, filed Oct. 2, 2019, the content of which is incorporated by reference herein in its entirety.

BACKGROUND

Technical Field

The disclosed technology generally relates to the technical field of magnetic devices and methods of forming magnetic devices such as magnetic memory and/or logic devices.

Description of the Related Technology

Current-induced domain wall (DW) motion in ferromagnetic nanowires has emerged as a promising field in spintronics. It has drawn considerable interest due to its prospective applications in future magnetic devices, such as logic and racetrack memory devices, paving the way to store and manipulate information for computation. A number of proposals for building magnetic devices with ultra-high storage density and low power consumption are based on DW concepts.

SUMMARY OF CERTAIN INVENTIVE ASPECTS

The disclosed technology can relate to magnetic devices. The magnetic device can comprise a hybrid free layer of a perpendicular magnetic tunnel stack, which can be based on an interlayer interposed between two free magnetic layers. The magnetic device may be a spin torque majority gate (STMG) device, a domain wall (DW) logic device, or a magnetic DW racetrack memory device.

An article of Parkin et al., entitled "Memory on the racetrack," as published in *Nature Nanotechnology* 10, 195 in March 2015, presents a racetrack memory concept using DW motion in nanowires. In this device, information is stored in DWs along a nanowire, which are shifted synchronously by applying current pulses and/or field pulses. The racetrack memory can have the advantage of combining the high information density of a hard disk memory with the reliability of a solid-state memory, due to its capability to store several DWs in a small area.

Another concept based on DW motion refers to DW logic devices. Such devices can be considered as an alternative to continue scaling down integrated logic circuits and circumventing the limitations of complementary metal oxide semiconductor (CMOS) at low dimensions. In spin logic devices, the logic information can be stored in a position of a DW in a ferromagnetic nanowire. The propagation and merging of DWs between magnetization states can then be used to program a logic function.

In general, the operation principle of DW-based devices can rely on three mechanisms: DW writing and DW reading at two ends of a nanotrack, and DW transport along the nanotrack. FIG. 7 schematically shows components of an example DW-based device 70. Input data can be encoded into a DW in a free layer 72 of a magnetic tunnel junction (MTJ) stack (or pillar) located at one end of the nanotrack. DW can be written into the nanotrack by sending a spin-polarized current to the free layer 72 by spin torque transfer (STT) phenomenon. The data can then be transferred to an output MTJ stack by the propagation of a DW along the nanotrack under application of current pulses. Arrival of the DW at the output stack (or pillar) can be subsequently read using the tunnel magnetoresistance (TMR) effect.

For practical applications, it is desirable that DW-based devices have high TMR ratio for fast and reliable reading, low switching current for low power consumption and high reliability, and high speed of DW motion for fast operation. Typically, MTJs with perpendicular magnetic anisotropy (PMA) have been considered to be the core of high performance magnetic random-access memory (MRAM) stack designs, since they enable high TMR and low switching currents.

As depicted in FIG. 7, an example MTJ may comprise a fixed layer 73, made of a synthetic antiferromagnetic (SAF) structure and used also as a reference layer (RL), a magnesium oxide (MgO) tunnel junction/barrier 71, and a free layer 72 that can be made of a cobalt-iron-boron (CoFeB) alloy or a similar material. This system can rely on PMA originating at the interface of the CoFeB layer 72 and the MgO layer 71. Even though MTJs with PMA have potential for realizing high-density non-volatile devices, because of their good scaling qualities, the DW-based devices 70 with such stack designs possess several challenges.

One of the drawbacks of using the example interfacial PMA in CoFeB/MgO stack designs as a building block for a DW conduit layer or nanotrack, is that they can exhibit very low DW speed. The speed of a DW driven by a magnetic field can be limited by the so-called Walker breakdown, which can indicate the maximum velocity at which DWs can propagate in magnetic nanowires without changing their structure. Owing to a low damping constant, CoFeB layers can lead to a very low Walker breakdown field that relates to the stability of the DW structure. In particular, above the Walker breakdown field, due to magnetization inside the DW, the CoFeB-based design can become unstable. Moreover, DW speed can be limited by emergence of pinning sites in annealed CoFeB films due to the presence of grain boundaries in its crystalline texture.

Another challenge for DW-based device integration can refer inherently to the manufacturing process, which includes a pillar patterning step. This pillar patterning step can include etching the material stack, and stopping in a controlled manner directly on the MgO tunnel barrier layer 71 (e.g., just above the free layer 72 for a top-pinned device 70 as shown in FIG. 7) to electrically isolate while magnetically connecting the free layer to enable DW transport.

Etching all the way to the MgO layer 71 can avoid shorting current paths between the pillars, as depicted in FIG. 8A. However, during the etch process, etching ions can in many instances, inevitably penetrate a few nm deep into the material. Although the magnetic properties of the free layer 72 underneath the pillars may be maintained, damage to the MgO tunnel barrier layer 71 in the inter-pillar spacing can cause a loss of PMA in the shared free layer 72, see FIG. 8B. This can prevent DW propagation between pillars and, consequently, result in non-functional devices 70.

US 2017/0179373 A1 discloses a possible solution for reducing potential etch damage of a DW conduit in a STMG device. Nevertheless, this document does not envisage a manner to improve DW speed, nor to achieve lower STT switching.

In view of the above-mentioned challenges and disadvantages of the example MTJ stack designs for DW transport, embodiments of the disclosed technology aim to provide an improved magnetic device. One objective is in particular to enhance DW speeds in the magnetic device. Further, it is desirable that the magnetic device be more robust to the etch stop conditions mentioned above. Another goal is to design a material stack having low switching current and high TMR of the magnetic device.

The objectives can be achieved by various embodiments of the disclosed technology, e.g., as provided in the enclosed independent claims. Advantageous implementations of some embodiments are also defined in the dependent claims.

The magnetic device according to various embodiments of the technology herein disclosed may also be a spintronic device.

Certain embodiments of the disclosed technology can include a magnetic device comprising a hybrid free layer design, wherein an interlayer is interposed between two magnetic free layers and allows magnetic coupling of the free layers through exchange interaction. Thereby, various embodiments of the disclosed technology can include both bottom-pinned and top-pinned magnetic devices. For a top-pinned device, the hybrid free layer can be arranged at the bottom of the full device (e.g., MRAM) stack, whereas for a bottom-pinned device, the hybrid free layer can be arranged at the top of the stack. In this description, the top-pinned device geometry can be considered to realize spin logic devices, such as the STMG device, and a racetrack memory device, although bottom-pinned structures can be analogously applied. In some of these types of devices, magnetic information is propagated via magnetic DW motion, hence desirable properties of the hybrid free layer can include high DW speed, and robustness against DW pinning.

One aspect of the disclosed technology provides a magnetic device comprising: a seed layer; a first free magnetic layer provided on the seed layer; an interlayer provided on the first free magnetic layer; a second free magnetic layer provided on the interlayer, wherein the first free magnetic layer and the second free magnetic layer are ferromagnetically coupled across the interlayer through exchange interaction; a tunnel barrier provided on the second free magnetic layer; and a fixed magnetic layer.

In this document, a layer being "provided on" another layer may either refer to the layer being arranged "below" (for a top-pinned device) or "above" (for a bottom-pinned device) the other layer. Thereby, the terms "below"/"above" or "bottom"/"top" relate to layers of the material stack, for example, to the fabrication/growth direction of these layers. In any case, "provided on" may refer to the layer being in contact with the other layer. For instance, the layer may be (epitaxially) grown on the other layer.

The magnetic device of one aspect is designed to provide PMA, high TMR and low switching current at the interface of the tunnel barrier and the second free magnetic layer. Moreover, in various implementations, the magnetic device can also be configured or optimized for high DW speeds arising from the interface of the first free magnetic layer and the seed layer. Further, the interlayer can provide a structural transition between the first and second free magnetic layers by enabling them to ferromagnetically couple through exchange interaction. Further, for logic or DW transport applications, the magnetic device of one aspect can be robust to the above-described etch stop conditions.

In some such implementations, input switching and DW transport mechanisms can be decoupled in the magnetic device, allowing for independent configuration or optimization of both mechanism without compromise.

In an implementation of the magnetic device, the interlayer can comprise a heavy-metal layer or a heavy-metal-transition-metal alloy layer. Additionally or alternatively, a thickness of the interlayer can be in a range of 0.1-1 nm.

In particular, the heavy-metal layer comprised by the interlayer may be tungsten (W), tantalum (Ta), niobium (Nb), or molybdenum (Mo). The heavy-metal-transition-metal alloy layer may comprise tantalum-cobalt-iron-boron (TaCoFeB), tantalum-iron (TaFe), tantalum-cobalt-iron (TaCoFe), tantalum-cobalt (TaCo), tungsten-cobalt-iron-boron (WCoFeB), or any combination thereof.

In an implementation of the magnetic device, the fixed magnetic layer comprises a synthetic antiferromagnetic-based layer.

The fixed magnetic layer may further be or comprise a CoFeB layer.

In an implementation of the magnetic device, the second free magnetic layer can comprise a CoFeB-based layer. In addition to this or as an alternative, the second free magnetic layer can comprise an iron-boron (FeB)-based layer.

The CoFeB-based layer can be a CoFeB layer. The FeB-based layer can be a FeB layer.

In an implementation of the magnetic device, the tunnel barrier can be an MgO-based layer.

The MgO-based tunnel barrier can be an MgO layer. However, it can generally be a layer based on MgO, for instance, an $MgGaO_x$ or $MgAlO_x$ layer. $O_x$ can, e.g., be O, $O_2$, $O_3$, etc.

In an implementation of the magnetic device, the first free magnetic layer can comprise an intrinsic perpendicular magnetic anisotropy layer of an iron-platinum (FePt) alloy, a platinum/cobalt (Pt/Co) alloy, a cobalt/nickel (Co/Ni) alloy, a cobalt-palladium (CoPd) alloy, or a combination thereof.

In a further implementation of the magnetic device, the first free magnetic layer can comprise an intrinsic perpendicular magnetic anisotropy layer of synthetic antiferromagnetic cobalt/ruthenium/cobalt (Co/Ru/Co) multilayers and/or cobalt/nickel/ruthenium/cobalt/nickel (Co/Ni/Ru/Co/Ni) multilayers and/or ferrimagnetic materials comprising gadolinium-cobalt (GdCo) alloy and/or terbium-cobalt (TbCo) alloy.

The first free magnetic layer may also comprise a structure of the type gadolinium-cobalt/ruthenium/cobalt (GdCo/Ru/Co) or of the structure terbium-cobalt/ruthenium/cobalt (TbCo/Ru/Co), wherein Ru may be in the range of 0.4-2 nm. The Ru can be beneficial is some instances to prevent diffusion of the rare earth element upon annealing.

Advantageously, in various implementations, the intrinsic PMA of the first free magnetic layer can enable robustness against an etching process while maintaining a magnetic moment lower than a double-MgO free layer design, which can help provide low switching current.

In an implementation of the magnetic device, the seed layer can comprise a heavy-metal layer of platinum (Pt), tungsten (W), hafnium (Hf), or tantalum (Ta). Additionally or alternatively, the seed layer can comprises a topological insulator layer of bismuth selenide ($Bi_2Se_3$), bismuth telluride ($Bi_2Te_3$), antimony telluride ($Sb_2Te_3$), or bismuth antimonide (BiSb).

It is to be noted that Dzyaloshinskii-Moriya Interaction (DMI) may arise at the interface of the first free magnetic layer and the heavy-metal or topological insulator seed layer due to broken inversion symmetry and strong spin orbit coupling (SOC) provided by the heavy-metal or topological insulator seed layer. The DMI may stabilize a DW structure which consequently can result in higher DW speeds by extending the steady motion regime to larger magnetic field values.

Further, in various implementations, a spin current flowing in the heavy-metal seed layer or topological insulator seed layer may generate a spin current via spin Hall effect (SHE), exerting a torque on a DW in the first magnetic free layer. Thus, the heavy-metal or topological insulator seed layer can provide the spin orbit torque (SOT) effect that enables an efficient way to propagate DW at high speed and low driving current density.

It is an advantage of the magnetic device of various implementations to provide high DW speed motion due to the combination of the DMI and the SOT effect originated from the heavy-metal or topological insulator seed layer.

In an implementation of the magnetic device, two or more exposed layer stacks, for example, two or more pillars, can be structured from one of the fixed magnetic layer; the fixed magnetic layer and the tunnel barrier; or the fixed magnetic layer, the tunnel barrier, and the second free magnetic layer.

This can provide in some implementations the advantage that the magnetic device can easily be integrated into DW-based devices with different potential applications.

In an implementation of the magnetic device, the interlayer, the first free magnetic layer, and the seed layer can be continuous between the two or more exposed layer stacks.

This can be beneficial in some implementations, since the magnetic device can provide a DW conduit for high DW speed motion and resistant to etching process as explained above.

In an implementation of the magnetic device, the magnetic device can comprise four or more terminals, wherein two terminals can be connected to the seed layer and wherein one terminal can be connected to each exposed layer stack. As used herein, reference to "each" of a particular element (e.g., "each exposed layer stack") may refer to two or more of the elements, and may or may not refer to every one of the elements in the device. For example, "each exposed layer stack" may refer to individual ones of a plurality of exposed layer stacks and not necessarily every single exposed layer stack in the device.

This can provide in some implementations, the advantage that DW writing and DW reading to/from the exposed layer stacks with STT, while DW motion driven by SOT can also be implemented through the terminals connected to the seed layer. Further, a combination of STT and SOT driven DW transport may increase the capabilities of the magnetic device for prospective applications in fast logic circuit operations.

In an implementation of the magnetic device, the magnetic device can be a memory device, for example, a magnetic DW racetrack memory device.

In a further implementation of the magnetic device, the magnetic device can be a DW logic device, for example, a spin torque majority gate device.

Another aspect of the disclosed technology provides a method comprising processing steps to manufacture a magnetic device as described above.

The method may comprise the steps of: providing a seed layer; providing a first free magnetic layer on the seed layer; providing an interlayer on the first free magnetic layer; providing a second free magnetic layer on the interlayer, wherein the first free magnetic layer and the second free magnetic layer are ferromagnetically coupled across the interlayer through exchange interaction; providing a tunnel barrier on the second free magnetic layer; and providing a fixed magnetic layer.

The method of various implementations can be further developed according to the foregoing implementations of the magnetic device. The method of various implementations thus can achieve the same advantages as various implementations of the magnetic device.

BRIEF DESCRIPTION OF THE DRAWINGS

The above-described aspects and implementations of the disclosed technology are explained in the following description of embodiments with respect to the enclosed drawings, in which.

DETAILED DESCRIPTION OF CERTAIN ILLUSTRATIVE EMBODIMENTS

Figure 1:
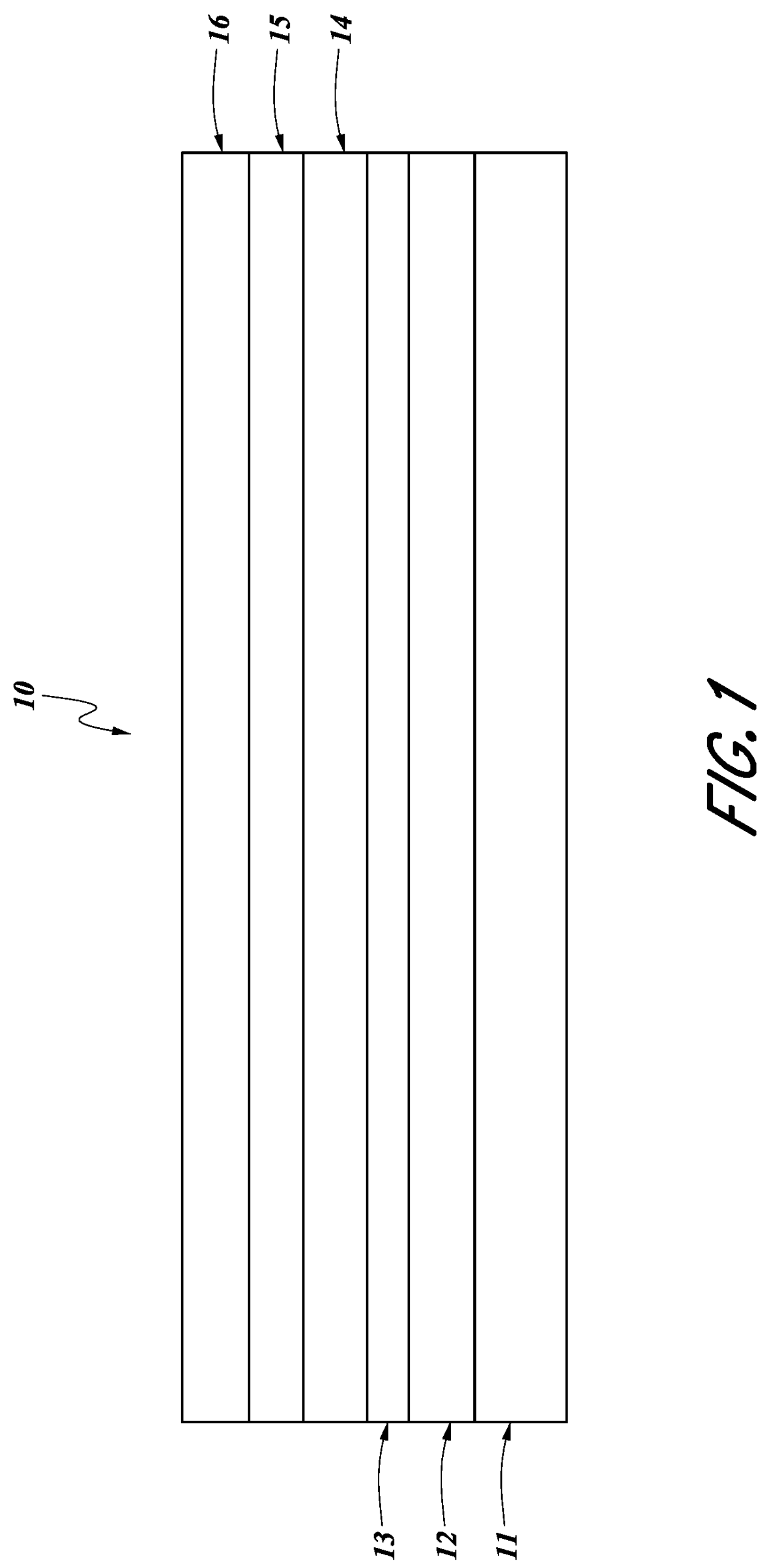
FIG. 1 shows a magnetic tunnel junction (MTJ) layer stack for a magnetic device according to an embodiment of the disclosed technology.

An initial MTJ layer stack for a magnetic device 10 according to an embodiment of the disclosed technology is depicted in FIG. 1. The magnetic device 10 may be a logic device or a memory device. The magnetic device 10, in general, may be a spintronic device. In particular, the magnetic device 10 may be a magnetic racetrack memory device, a DW logic device, or a STMG device.

The layer stack for the magnetic device 10, as disclosed herewith, generally can comprise a seed layer 11; a first free magnetic layer 12 provided on the seed layer 11; an interlayer 13 provided on the first free magnetic layer 12; a second free magnetic layer 14 provided on the interlayer 13, wherein the first free magnetic layer 12 and the second free magnetic layer 14 are ferromagnetic ally coupled across the interlayer 13 through exchange interaction; a tunnel barrier 15 provided on the second free magnetic layer 14; and a fixed magnetic layer 16.

In some embodiments, the layer stack for the magnetic device 10 shown in FIG. 1, can be composed of the following materials:

A seed layer 11 comprising a heavy-metal layer, e.g., a Pt, W, Hf, or Ta layer. Alternatively or additionally, it may comprise a topological insulator, such as $Bi_2Se_3$, $Bi_2Te_3$, $Sb_2Te_3$, or BiSb. It is noted that the materials envisaged for the seed layer 11 can provide high spin orbit coupling (SOC). Such a layer can also be referred to as a spin orbit torque (SOT) layer.

An intrinsic PMA layer as the first free magnetic layer 12. The first free magnetic layer 12 may comprise a FePt alloy, a Pt/Co alloy, a Co/Ni alloy, a CoPd alloy, or any combination thereof. Alternatively, the first free magnetic layer 12 may comprise an intrinsic PMA layer of synthetic antiferromagnetic Co/Ru/Co multilayers and/or Co/Ni/Ru/Co/Ni multilayers and/or ferrimagnetic materials comprising GdCo alloy and/or TbCo alloy. In some instances, the first free magnetic layer 12 may comprise a GdCo/Ru/Co structure, or a TbCo/Ru/Co structure. The first free magnetic layer 12 may be or can comprise a trilayer/SAF arrangement. The first free magnetic layer 12 may comprise a ferromagnetic laminate, antiferromagnetic structure, or ferrimagnet material.

An interlayer 13, for ferromagnetic ally coupling the PMA first free magnetic layer 12 and the second free magnetic layer 14 through exchange interaction. The interlayer 13 may comprise a heavy-metal layer, such as Ta, W, Nb, or Mo. Alternatively, the interlayer 13 may comprise a heavy-metal-transition-metal alloy, such as TaCoFeB, TaFe, TaCoFe, TaCo, WCoFeB, an XCoFeB alloy, or any combination thereof. Further, a thickness of the interlayer 13 may be in a range of 0.1-1 nm.

A CoFeB layer as the second free magnetic layer 14. The second free magnetic layer 14 may alternatively be or comprise a FeB layer.

A non-magnetic MgO layer as the tunnel barrier 15.

A synthetic antiferromagnetic (SAF) layer as the fixed layer 16. The fixed layer 16 can have a fixed magnetization moment, and may comprise a pinning layer. The fixed layer 16 may in some instances be a state of the art SAF layer.

In an embodiment, the seed layer 11 can be a heavy metal layer or a topological insulator, the first free magnetic layer 12 can be an intrinsic PMA layer, the second free magnetic layer 14 can be a CoFeB layer, the tunnel barrier 15 can be an MgO layer, and the fixed layer 16 can be an SAF layer.

It can be noticed that the fixed layer 16, the tunnel barrier 15 and the second free magnetic layer 14 can correspond to a material stack design used in STT-MRAM stacks, which has the role to provide PMA and low switching current. Further, the design of these three layers can also provide the TMR effect for device reading and the STT effect for device writing. These can be enabled by high spin polarization and low damping constant of the CoFeB layer 14, and by interfacial PMA generated at the interface of the CoFeB-based layer 14 and MgO-based layer 15.

In various implementations, the role of the heavy-metal-based or topological insulator-based seed layer 11 is to provide DMI at the interface with the intrinsic PMA first free magnetic layer 12, and SOT for DW motion.

In some implementations, the role of the interlayer 13 is to make a structural transition between the CoFeB-based second free magnetic layer 14 and the first free magnetic layer 12.

The thickness of the interlayer 13 may be tuned in a manner that the first free magnetic layer 12 and the second free magnetic layer 14 are ferromagnetically coupled through exchange interaction. Therefore, in various implementations, the first free magnetic layer 12, the interlayer 13 and the second free magnetic layer 14 can be considered as a single ferromagnetic layer. The magnetic device 10 can then be referred to as a hybrid free magnetic layer stack through this description.

Further, the first free magnetic layer 12 may be designed to provide intrinsic PMA for robustness against etching, as explained herein, while maintaining a low magnetic moment. In this manner, the total magnetic moment of the first 12 and second 14 free magnetic layers may be lower than or equal to 250 μemu/cm$^2$ (e.g., lower than or equal to the magnetic moment for a double-MgO free layer stack design). Additionally or alternatively the total magnetic moment of the magnetic device 10 may be lower than 1000 μemu/cm$^2$. This can be desirable for low switching current.

It should be noted that different combinations of materials according to the above-provided example materials are also possible in order to provide the magnetic device 10.

In an embodiment of the disclosed technology, the magnetic device 10 for a DW-based device application may comprise two or more exposed layer stacks, for example, two or more pillars. The two or more exposed layer stacks or pillars can be structured from one of: the fixed magnetic layer 16; the fixed magnetic layer 16 and the tunnel barrier 15; or the fixed magnetic layer 16, the tunnel barrier 15, and the second free magnetic layer 14. The exposed layer stacks or pillars may be embodied by etching processes stopping (exactly in various instances) at the tunnel barrier 15, at the second free magnetic layer 14 or at the interlayer 13, respectively.

Figure 2:
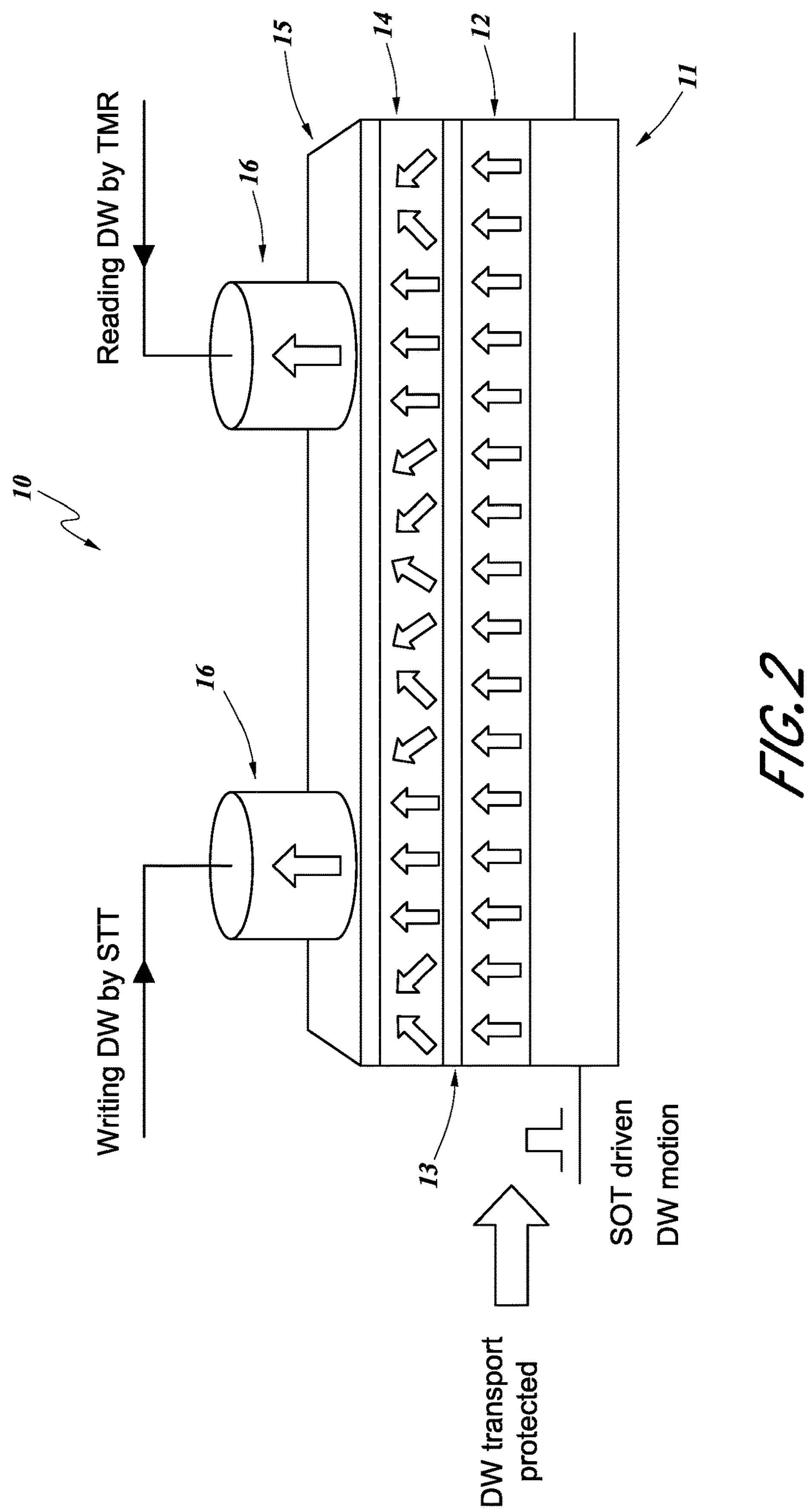
FIG. 2 shows a magnetic device according to an embodiment of the disclosed technology, for applications as domain wall (DW) logic device or racetrack memory with high DW speed.

The magnetic device 10 of FIG. 2, according to an embodiment of the disclosed technology, has in particular two exposed layer stacks or pillars structured from the fixed magnetic layer 16. The magnetic device 10 further comprises the seed layer 11; the first free magnetic layer 12 provided on the seed layer 11; the interlayer 13 provided on the first free magnetic layer 12; the second free magnetic layer 14 provided on the interlayer 13, wherein the first free magnetic layer 12 and the second free magnetic layer 14 are ferromagnetic ally coupled across the interlayer 13 through exchange interaction; and the tunnel barrier 15 provided on the second free magnetic layer 14, as described above with respect to FIG. 1.

Further, the interlayer 13, the first free magnetic layer 12, and the seed layer 11 can be continuous between the two or more exposed layer stacks. Here, continuous between the two or more exposed layer stacks, can refer to the layer(s) remaining unpatterned during the manufacturing process of the pillars, and can be common to or shared between the pillars, as can be seen in FIG. 2, providing a DW conduit or nanotrack for DW transport. In some instances, the layer(s) may remain unpatterned only during the manufacturing process of the pillars, but may be patterned in a further step of the manufacturing process, e.g., in order to form the shape of the device (e.g., to form a nanotrack for racetrack memory devices, or to form a cross shape for STMG device).

Depending on the layers comprised in the two or more exposed stack layers or pillars, the tunnel barrier 15 can also be continuous between the pillars, as illustrated in FIG. 2.

In the embodiment of FIG. 2, the magnetic device 10 further can comprise four terminals, wherein two terminals are connected to the seed layer 11, and wherein one terminal is connected to each exposed layer stack. It should be mentioned that the magnetic device 10 may comprise more than four terminals.

The magnetic device 10 of FIG. 2 presents three mechanisms of a DW-based device: DW writing and reading at the pillars located at the two ends of a nanotrack (formed by the shared layers), and DW transport along the nanotrack.

In operation, a magnetization direction of the fixed layer 16 can be fixed while a magnetization direction of the second free magnetic layer 14 can be modified via STT effect at one of the pillars by using a terminal connected to it. Due to the ferromagnetic coupling provided across the interlayer 13, the first free magnetic layer 12 can switch its magnetization together with the CoFeB-based second free magnetic layer 14. In this manner, a DW can be generated at a first pillar, which can also be referred to as an input or input pillar. The DW can then propagate via the common first free magnetic layer 12 towards the second pillar (or output pillar). At the output, arrival of the DW can switch a magnetization direction of the CoFeB-based second free magnetic layer 14, which can then be sensed by TMR effect using a terminal.

Further, by using intrinsic PMA materials for the first free magnetic layer 12, the first free magnetic layer 12 can be decoupled from the interfacial PMA at CoFeB-based layer 14 and MgO-based layer 15 and hence can tolerate a wider etching window. In this manner, in various implementations, damage to the MgO-based tunnel barrier layer 15 in the inter-pillar space has little effect or does not influence PMA in the shared first free magnetic layer 12 (e.g., in the conduit) and, hence, has little effect or does not affect DW transport.

Figure 3B:
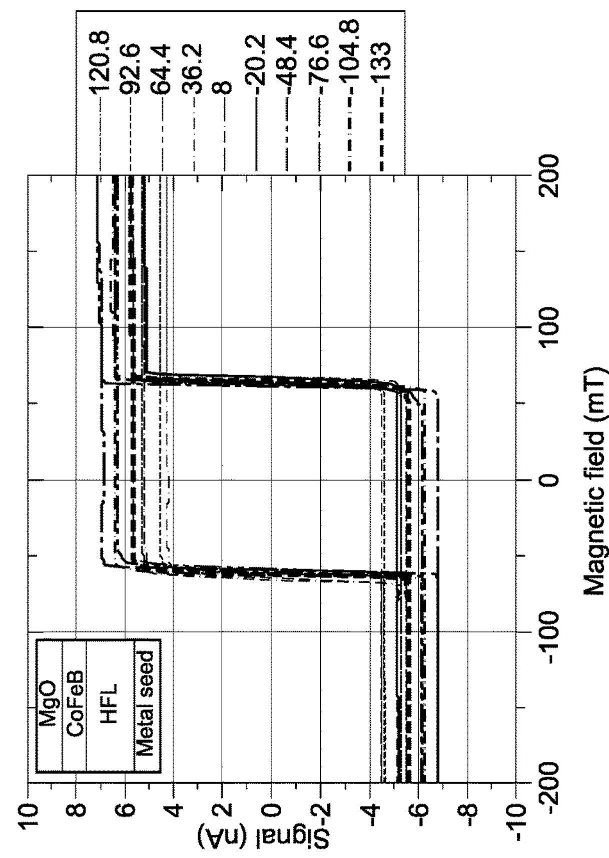
FIGS. 3A-3B show magnetic properties for an example magnetic device and for a magnetic device after pillar etch stop according to an embodiment of the disclosed technology, respectively.
Figure 3A:
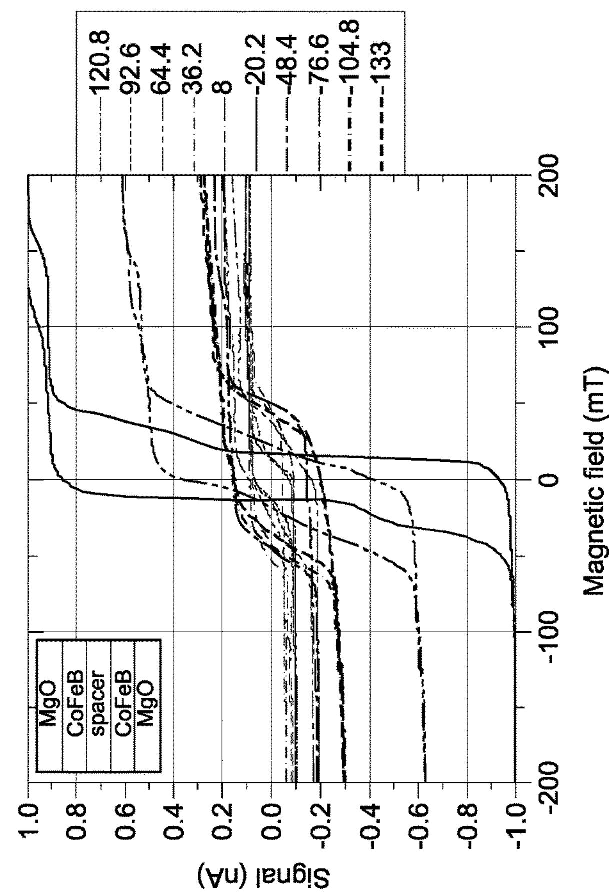

This can be proven by experimental results for an example dual MgO stack design and for the hybrid free layer stack design of the disclosed technology as shown in FIG. 3A and FIG. 3B, respectively. The squared hysteresis loops observed in FIG. 3B reveal that the magnetic device 10 is more robust to etching compared to the example dual MgO materials stack, cf. FIG. 3A. These results also demonstrate that the magnetic device 10, according to embodiments of the disclosed technology, provides excellent protection of the magnetic DW conduit against etching process for device integration. In this manner, functional DW-based devices in which the input and the output are electrically isolated but magnetically connected, can be achieved.

It is an advantage of the magnetic device 10 of various implementations that DW input and DW propagation can be decoupled, allowing for an independent configuration or optimization of both mechanism without compromise.

Further, the DMI at the interface of the first free magnetic layer 12 and the seed layer 11 comprising a heavy-metal or topological insulator with high SOC, can act as an effective longitudinal field which can force the magnetization direction within the DW to maintain in chiral Neel configuration. The propagation of chiral Neel DW along the shared first free magnetic layer 12, can suppress precession of the DW magnetization and thus can extend the steady motion regime to larger fields. As a result, the magnetic device 10 in various implementations, e.g., as illustrated in FIG. 2, can provide enhanced DW speed due to chiral Neel DW motion.

Advantageously, very high DW velocity of approximately 300 m/s (Ajejas et al., "Tuning domain wall velocity with Dzyaloshinskii-Moriya interaction", *Appl. Phys. Lett.,* 111 (20), 202402, (2017)) can be expected in the magnetic device 10, which is almost two orders of magnitude larger than that achieved in the other example material stack design. This high DW speed can be regulated by tuning the DMI contribution at the interface of the first free magnetic layer 12 and the seed layer 11.

In the magnetic device 10 of FIG. 2, a spin current can be injected into the first free magnetic layer 12 from the seed layer 11 by SOT (via the two terminals connected to the seed layer 11). This may be supported by a high SOT efficiency layer as the seed layer 11, like Pt, Ta, W or Hf heavy-metal or a topological insulator layer with high SOC. Advantageously, SOT driven DW motion can be highly efficient, enabling to achieve DW speed of approximately 400 m/s (Miron et al., "Fast current-induced domain-wall motion controlled by the Rashba effect", *Nature Materials,* 10, 419-423, (2011)).

Furthermore, in the magnetic device 10, DW direction of motion and DW speed may be tuned selectively by engineering the interface of the first free magnetic layer 12 and the seed layer 11. This can be achieved by varying the heavy-metal or topological material choice for the seed layer 11 and/or the composition of the first free magnetic layer 12.

The seed layer 11 comprising a heavy-metal layer or a topological material with high SOC can be helpful for enhancing the DW speed in the magnetic device 10 of the disclosed technology, since it can serve simultaneously as a source of SOT and interfacial DMI.

Moreover, without being bound by theory, due to low or a lack of stray fields in ferrimagnets and antiferromagnets, it is a further advantage of the magnetic device 10 of various implementations that DWs can be closely packed enabling smaller physical DW-device dimensions. Also, DWs motion can be achieved with high efficiency, since DW speed driven by SOT may reach 750 m/s (Yang et al., "Domain-wall velocities of up to 750 m s-1 driven by exchange-coupling torque in synthetic antiferromagnets", *Nature Nanotechnology,* 10, 221-226, (2015)) in synthetic antiferromagnetic materials and 1300 m/s (Caretta et al., "Fast current-driven domain walls and small skyrmions in a compensated ferrimagnet", *Nature Nanotechnology,* 13, 1154-1160 (2018)) in ferrimagnetic materials. Such materials, hence, may be used in the hybrid free magnetic layer design as promising solutions for high-performance and low-power DW-based devices.

The magnetic device 10 of FIG. 2, thus, not only can provide fast and reliable reading and low power consumption due to high TMR and low switching current (e.g., provided by the interface of a CoFeB-based second free magnetic layer 14 and the MgO-based tunnel barrier 15), but it can also offer further advantages by improving protection against etching process and high DW speed arising from the first free magnetic layer 12 and the heavy-metal or topological material seed layer 11.

Figure 4:
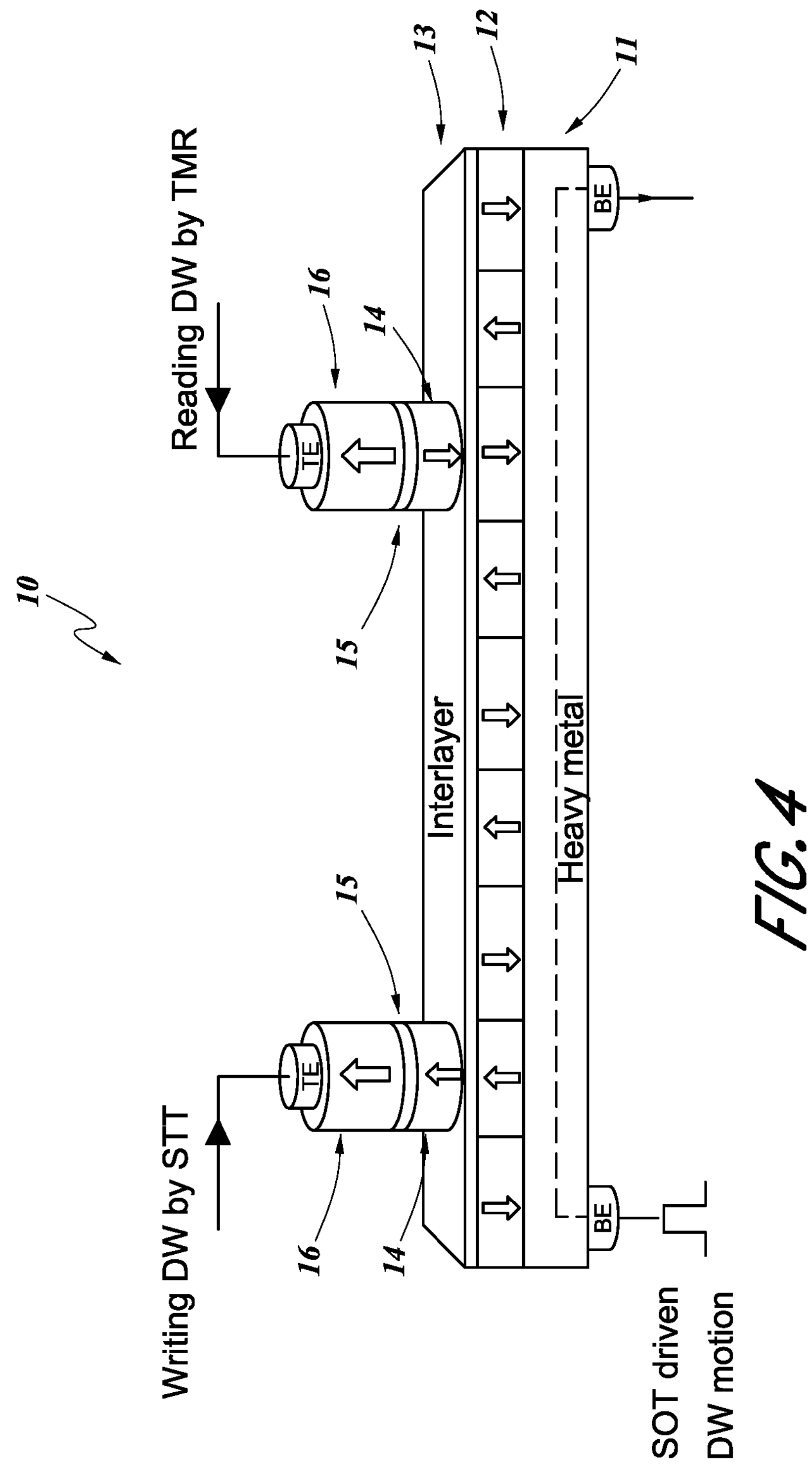
FIG. 4 shows a magnetic device according to an embodiment of the disclosed technology, for application as racetrack memory with high DW speed.

FIG. 4 shows a magnetic device 10 according to an embodiment of the disclosed technology, for a memory device application. In particular, the magnetic device 10 of FIG. 4 is a magnetic DW racetrack memory device.

The magnetic device 10 can include the seed layer 11; the first free magnetic layer 12 provided on the seed layer; the interlayer 13 provided on the first free magnetic layer 12; the second free magnetic layer 14 provided on the interlayer 13, wherein the first free magnetic layer 12 and the second free magnetic layer 14 are ferromagnetically coupled across the interlayer 13 through exchange interaction; the tunnel barrier 15 provided on the second free magnetic layer 14; and the fixed magnetic layer 16.

Moreover, in the magnetic device 10 of FIG. 4, two exposed layer stacks, or pillars, are structured from the fixed magnetic layer 16, the tunnel barrier 15, and the second free magnetic layer 14. The interlayer 13, the first free magnetic layer 12 and the seed layer 11 are continuous between the two exposed layer stacks, as explained above. Additionally, the magnetic device 10 further comprises four terminals, two of which are connected to the seed layer 11, and one terminal is connected to each pillar.

In the magnetic device 10 of FIG. 4, writing into the second free magnetic layer 14 can be achieved by STT effect, via the terminal connected to one of the pillars, whereas DW motion is induced by SOT, via the two terminals connected to the seed layer 11. This may be supported by a high SOT efficiency layer as the seed layer 11, such as Pt, Ta, W or Hf or a topological insulator layer with strong SOC. Reading from the second free magnetic layer 14 can be carried out by TMR, via the terminal connected to the second (or output) pillar.

As can be seen in FIG. 4, the terminals may also comprise an electrode provided on the pillars and/or on the seed layer 11.

Due to the ferromagnetic coupling between the first 12 and second 14 free magnetic layers, and the DMI and SOT originated at the interface between the first free magnetic 12 and seed 11 layers, the magnetic device 10 of FIG. 4 can enable a DW conduit for high DW speed which can also be robust to etching process. Furthermore, it can alleviate device integration challenges and enhance DW transport performance.

Figure 8B:
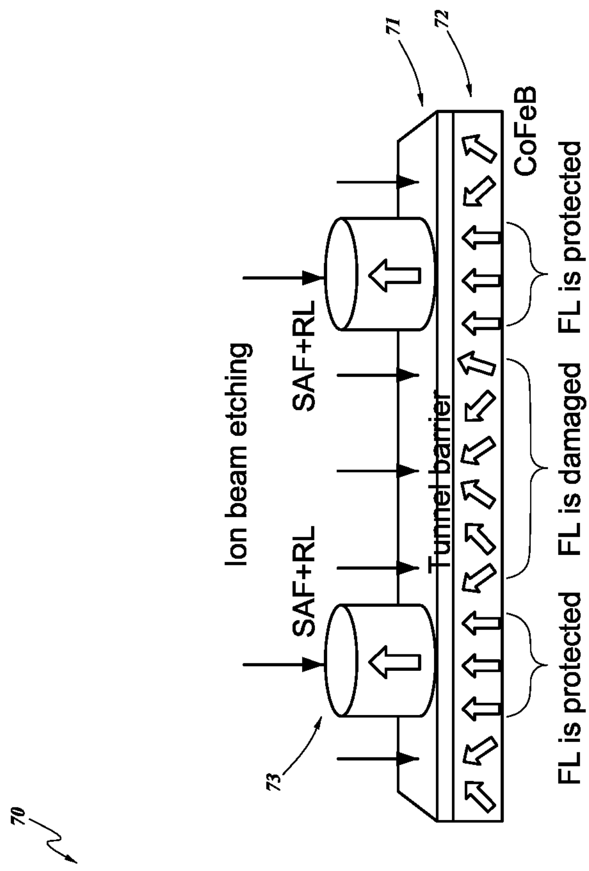
FIGS. 8A-8B show under etch stop patterning and over etch stop patterning respectively, in an example magnetic device.
Figure 8A:
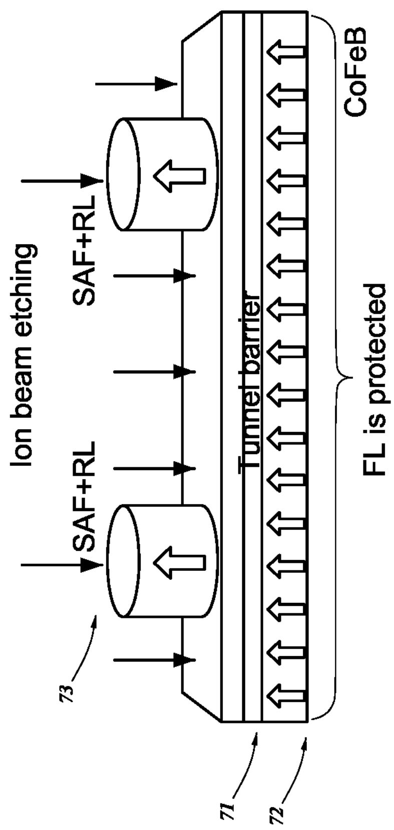

Notably, FIG. 2 and FIG. 4 show two extremes in the etch window that can be used for etching the pillars. In FIG. 2 the etch of the pillars is stopped at the tunnel barrier 15 as desired in the example device 70. However, as stated above, in various implementations, damage to the tunnel barrier 15 in the inter-pillar space of the magnetic device 10 has little effect or does not influence PMA in the shared first free magnetic layer 12 and, hence, has little effect or does not affect DW transport. FIG. 4 shows in this respect that the pillar etch is stopped only at the interlayer 13, which can be insensitive to etching, with little effect or without affecting the DW transport. This can be a major advantage of the magnetic device 10 and its manufacturing method over the example magnetic device 70 and its manufacturing method. In other words, the etching of the pillar, and the potential negative influences described in the background with respect to FIG. 8A and FIG. 8B, are reduced or not critical anymore. If the etching goes too deep and destroys the magnetization of the second free magnetic layer 14, this is not a problem in various implementations, as the first free magnetic layer 12 magnetization will have little effect or will not be influenced.

Figure 5:
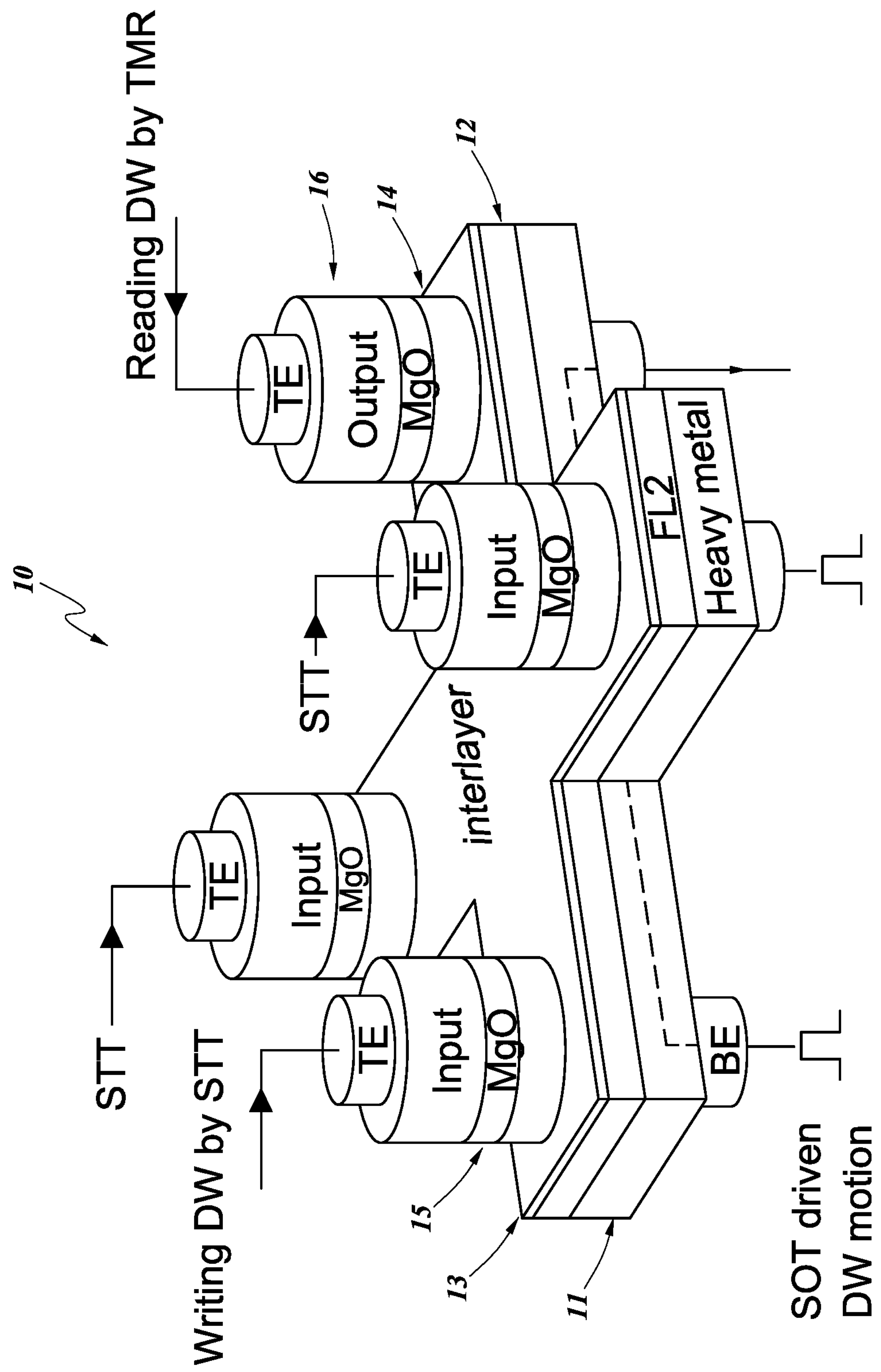
FIG. 5 shows a magnetic device according to an embodiment of the disclosed technology, for application as a spin torque majority gate (STMG) with high DW speed.

FIG. 5 shows a magnetic device 10 according to an embodiment of the disclosed technology, for DW logic device applications, for example, the magnetic device 10 may be a spin torque majority gate device. In this example embodiment, the magnetic device 10 comprises four exposed layer stacks, or pillars, which are structured from the fixed magnetic layer 16, the tunnel barrier 15, and the second free magnetic layer 14. Three of the pillars may be regarded as input pillars, whereas the fourth pillar can be considered as an output.

The interlayer 13, the first free magnetic layer 12, and the seed layer 11 are continuous between the exposed layer stacks and therefore are shared by the four separated pillars. Further, the magnetic device 10 comprises the first free magnetic layer 12 provided on the seed layer 11; the interlayer 13 provided on the first free magnetic layer 12; the second free magnetic layer 14 provided on the interlayer 13, wherein the first 12 and the second 14 free magnetic layers are ferromagnetically coupled across the interlayer 13 through exchange interaction; the tunnel barrier 15 provided on the second free magnetic layer 14; and the fixed magnetic layer 16 provided on the tunnel barrier 15, as described above with respect to FIG. 1.

The magnetic device 10 of FIG. 5 further comprises several terminals. Especially in this example, three terminals are connected to the seed layer 11 and one terminal is connected to each exposed layer stack or pillar. Further, the terminals shown in FIG. 5 also comprise each an electrode.

In the magnetic device 10 of FIG. 5, DW writing into the second free magnetic layer 14 can be carried out by STT (e.g., via one terminal connected to each input pillar, for example, to the fixed layer 16 of each pillar). DW reading can be carried out by TMR at the output pillar (e.g., via another terminal connected to the fixed layer 16 of the output pillar). DW transport can be achieved via the shared first free magnetic layer 12, driven by a SOT effect of the seed layer 11. For this, the terminals connected to the seed layer 11 may be used. The seed layer 11 may thus be a SOT generating layer, for instance, a Pt, Ta, W or Hf, or a topological insulator layer with high SOC.

It is an advantage of the magnetic device 10 of FIG. 5 that it can enable a spin torque majority gate which alleviates integration challenges as being robust to etching process, and improves DW transport performance due to high DW speed.

Figure 6:
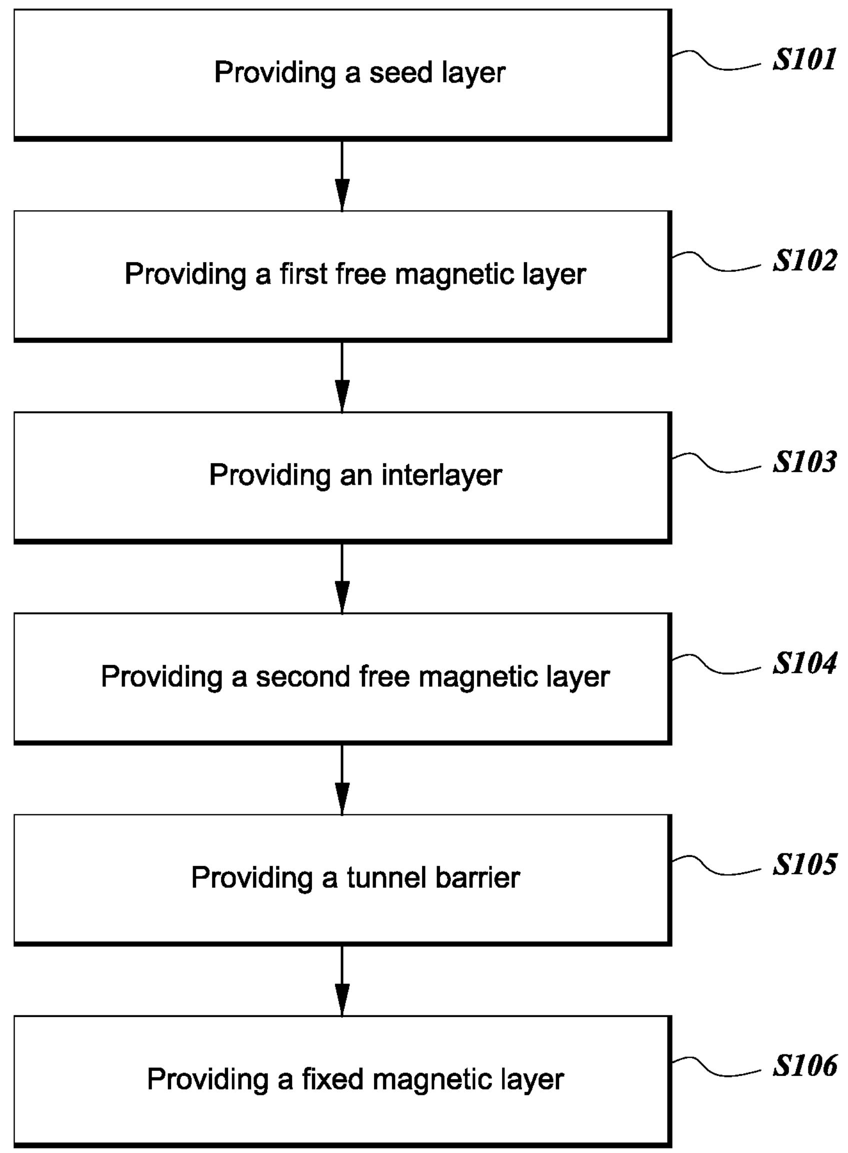
FIG. 6 shows a schematic representation of a method to manufacture a magnetic device according to an embodiment of the disclosed technology.
Figure 7:
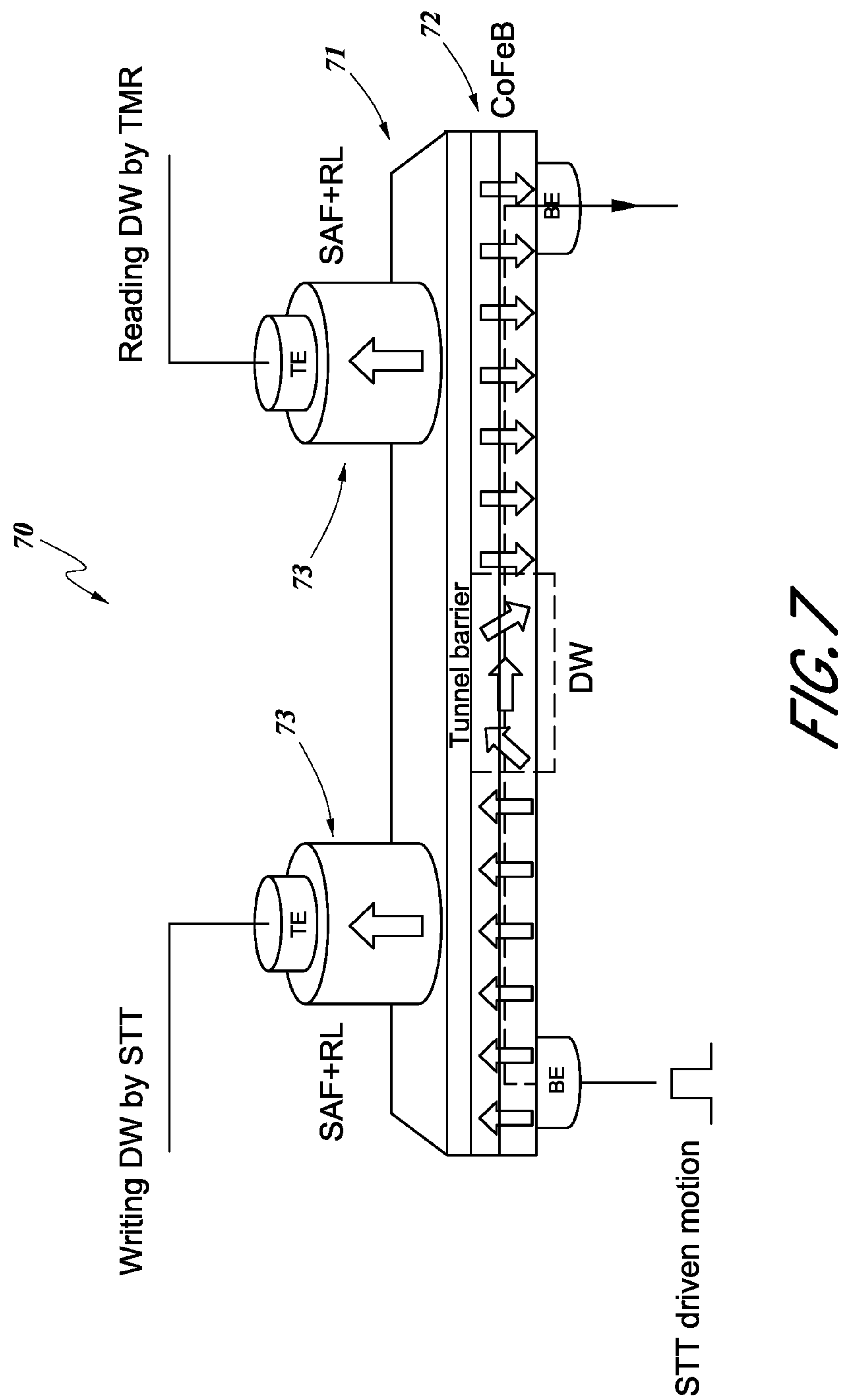
FIG. 7 shows an example of a magnetic device.

FIG. 6 shows a schematic representation of an embodiment for a method according to an aspect of the disclosed technology. The method can comprise processing steps to manufacture the magnetic device 10 as disclosed above.

The method may comprise the steps of: providing S101 a seed layer; providing S102 a first free magnetic layer on the seed layer; providing S103 an interlayer on the first free magnetic layer; providing S104 a second free magnetic layer on the interlayer, wherein the first free magnetic layer and the second free magnetic layer are ferromagnetically coupled across the interlayer through exchange interaction; providing S105 a tunnel barrier on the second free magnetic layer; and providing S106 a fixed magnetic layer.

It is to be noted that the foregoing steps are not necessarily implemented in the indicated order. For example, the method steps can relate to the relative position of the layers of the material stack, which can depend on the fabrication/growth direction of the layers. Thus, for example, for a bottom-pinned device stack design, the method steps can be understood in a reverse order.

The method may further comprise the step of structuring two or more exposed layer stacks, for example, two or more pillars, comprising one of: the fixed magnetic layer; the fixed magnetic layer and the tunnel barrier; or the fixed magnetic layer, the tunnel barrier, and the first free magnetic layer.

In addition to this, the step of providing four or more terminals, wherein two terminals are connected to the seed layer, and wherein one terminal is connected to each exposed layer stack, may also be comprised.

The method may be further developed to fabricate further features of the magnetic device 10, as described above. Hence, the method can achieve the same advantages as the magnetic device 10 of various implementations.

What is claimed is:

1. A magnetic device, comprising:

a seed layer;

a first free magnetic layer provided on the seed layer, wherein the seed layer is configured to provide Dzyaloshinskii-Moriya Interaction at an interface with the first free magnetic layer;

an interlayer provided on the first free magnetic layer;

a second free magnetic layer provided on the interlayer, wherein the first free magnetic layer and the second free magnetic layer are ferromagnetically coupled across the interlayer through exchange interaction;

a tunnel barrier provided on the second free magnetic layer; and a fixed magnetic layer.

2. The magnetic device according to claim 1, wherein the interlayer comprises a heavy-metal layer or a heavy-metal-transition-metal alloy layer.

3. The magnetic device according to claim 1, wherein the fixed magnetic layer comprises a synthetic antiferromagnetic-based layer.

4. The magnetic device according to claim 1, wherein the second free magnetic layer comprises a CoFeB-based layer and/or a FeB-based layer.

5. The magnetic device according to claim 1, wherein the tunnel barrier comprises a MgO-based layer.

6. The magnetic device according to claim 1, wherein the first free magnetic layer comprises an intrinsic perpendicular magnetic anisotropy layer formed of at least one of: a FePt alloy, a Pt/Co alloy, a Co/Ni alloy, and a CoPd alloy.

7. The magnetic device according to claim 1, wherein the first free magnetic layer comprises an intrinsic perpendicular magnetic anisotropy layer formed of synthetic antiferromagnetic Co/Ru/Co multilayers and/or Co/Ni/Ru/Co/Ni multilayers and/or ferrimagnetic materials comprising a GdCo alloy and/or a TbCo alloy.

8. The magnetic device according to claim 1, wherein the seed layer comprises a heavy-metal layer formed of Pt, W, Hf, or Ta, and/or comprises a topological insulator layer formed of $Bi_2Se_3$, $Bi_2Te_3$, $Sb_2Te_3$, or BiSb.

9. The magnetic device according to claim 1, wherein two or more exposed layer stacks are structured from one of:
- the fixed magnetic layer;
- the fixed magnetic layer and the tunnel barrier; and
- the fixed magnetic layer, the tunnel barrier, and the second free magnetic layer.

10. The magnetic device according to claim 9, wherein the interlayer, the first free magnetic layer, and the seed layer are continuous between the two or more exposed layer stacks.

11. The magnetic device according to claim 9, comprising:
- four or more terminals,
- wherein two terminals are connected to the seed layer, and wherein one terminal is connected to individual ones of the two or more exposed layer stacks.

12. The magnetic device according to claim 1, wherein the magnetic device is a memory device.

13. The magnetic device according to claim 1, wherein the magnetic device is a domain wall logic device.

14. A method of manufacturing a magnetic device, wherein the method comprises:
- providing a seed layer;
- providing a first free magnetic layer on the seed layer, wherein the seed layer is configured to provide Dzyaloshinskii-Moriya Interaction at an interface with the first free magnetic layer;
- providing an interlayer on the first free magnetic layer;
- providing a second free magnetic layer on the interlayer, wherein the first free magnetic layer and the second free magnetic layer are ferromagnetically coupled across the interlayer through exchange interaction;
- providing a tunnel barrier on the second free magnetic layer; and
- providing a fixed magnetic layer.

15. The magnetic device according to claim 1, wherein a thickness of the interlayer is in a range of 0.1-1 nm.

16. The magnetic device according to claim 12, wherein the memory device is a magnetic domain wall racetrack memory device.

17. The magnetic device according to claim 13, wherein the domain wall logic device is a spin torque majority gate device.

18. The method according to claim 14, further comprising structuring two or more exposed layer stacks comprising one of:
- the fixed magnetic layer;
- the fixed magnetic layer and the tunnel barrier; and
- the fixed magnetic layer, the tunnel barrier, and the second free magnetic layer.

19. The method according to claim 18, wherein the interlayer, the first free magnetic layer, and the seed layer are continuous between the two or more exposed layer stacks.

20. The method according to claim 19, further comprising:
- providing four or more terminals,
- wherein two terminals are connected to the seed layer, and wherein one terminal is connected to individual ones of the two or more exposed layer stacks.

21. A magnetic device, comprising:
- a seed layer;
- a first free magnetic layer provided on the seed layer;
- an interlayer provided on the first free magnetic layer, wherein the first free magnetic layer comprises an intrinsic perpendicular magnetic anisotropy layer formed of a FePt alloy, a Pt/Co alloy, a Co/Ni alloy, a CoPd alloy, Co/Ru/Co multilayers, Co/Ni/Ru/Co/Ni multilayers, a GdCo alloy, and/or a TbCo alloy;
- a second free magnetic layer provided on the interlayer, wherein the first free magnetic layer and the second free magnetic layer are ferromagnetically coupled across the interlayer through exchange interaction;
- a tunnel barrier provided on the second free magnetic layer; and
- a fixed magnetic layer.

* * * * *